United States Patent [19]

Kuo

[11] Patent Number: 4,640,846
[45] Date of Patent: Feb. 3, 1987

[54] SEMICONDUCTOR SPIN COATING METHOD

[76] Inventor: Yue Kuo, 1079 San Pablo Ave. #8, Albany, Calif. 94706

[21] Appl. No.: 654,441

[22] Filed: Sep. 25, 1984

[51] Int. Cl.$^4$ .................. B05D 5/12; H01L 21/312
[52] U.S. Cl. ........................... 427/82; 118/52; 118/53; 118/54; 427/240
[58] Field of Search .................. 427/82, 240; 118/52–54

[56] References Cited

U.S. PATENT DOCUMENTS

| | | | |
|---|---|---|---|
| 3,436,259 | 4/1969 | Regh et al. | 427/82 |
| 3,475,867 | 11/1969 | Walsh | 427/240 |
| 3,636,492 | 1/1972 | Yamashita et al. | 427/82 |
| 3,853,091 | 10/1974 | Christensen et al. | 118/53 |
| 4,267,212 | 5/1981 | Sakawaki | 427/240 |
| 4,347,302 | 8/1982 | Golman | 427/82 |

Primary Examiner—John D. Smith
Assistant Examiner—Janyce A. Bell
Attorney, Agent, or Firm—Townsend & Townsend

[57] ABSTRACT

An improved method for coating a semiconductor wafer with a uniform layer of photoresist or other liquid film is provided. The liquid is first semi-uniformly deposited on the wafer by spraying or otherwise. Thereafter, the wafer is rotated about an axis perpendicular to the plane of the wafer and removed from the wafer. In the preferred embodiment, a number of wafers are placed about the perimeter of a large, flat disc which is rotated about its center. The liquid is spread over the surface of each wafer by the centrifugal force generated by such rotation. By placing the wafers at a distance from the axis of rotation, the centrifugal force on all points of each wafer is approximately the same, thereby providing for a uniform spreading of the film over the wafer.

12 Claims, 5 Drawing Figures

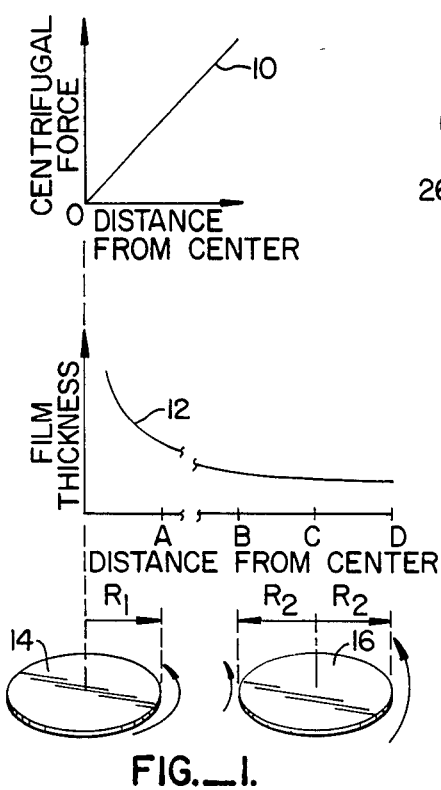
FIG._1.
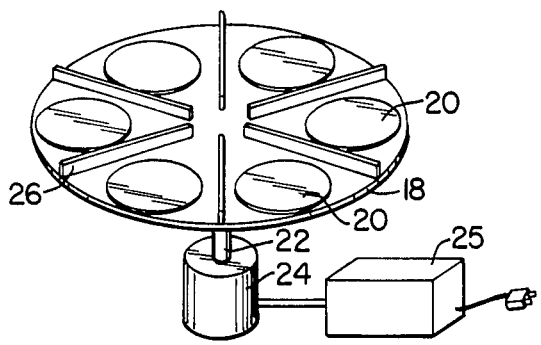
FIG._2.
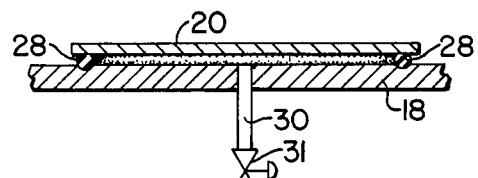
FIG._3.
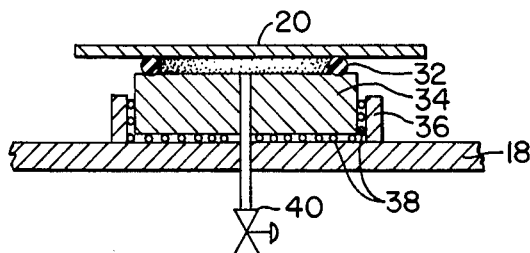
FIG._4.
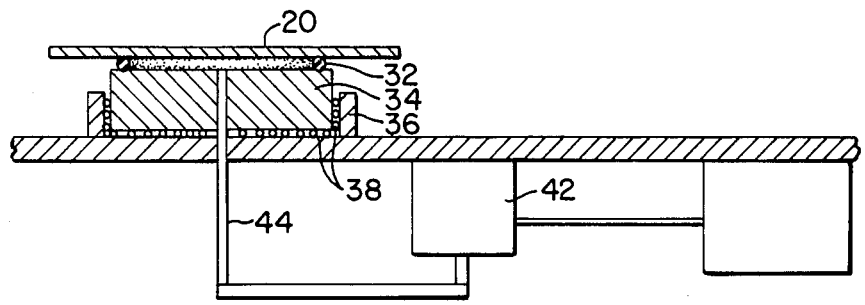
FIG._5.

SEMICONDUCTOR SPIN COATING METHOD

BACKGROUND OF THE INVENTION

This invention relates to the photolithographic, or masking, process in the manufacture of semiconductors, and more particularly to the coating of a semiconductor wafer with photoresist.

The manufacture of semiconductors usually includes several masking steps to form patterns on the semiconductor wafer for subsequent etching and diffusion, metalization or other steps. In a typical masking, or photolithographic process, the following steps occur:

(1) the wafer is coated with photoresist film;
(2) the wafer is baked to dry the film and enhance its adhesion to the wafer;
(3) the film is exposed to ultraviolet light, e-beams or x-rays through a photomask;
(4) the exposed film is removed with a developer solution;
(5) the wafer is baked to harden the photoresist pattern; and
(6) the wafer is etched with etchant where exposed film was removed.

In the first (coating) step, producing a thin and uniform film is critical to the remaining steps. If the film is too thick, it is difficult to obtain sharp patterns when the film is exposed. If the film is too thin, the photoresist may not adequately mask the whole material or it may form pinholes. If the film is not uniform, the removal of exposed film may be uneven and can lead to variable etch line widths and line discontinuities.

There are many methods of coating a wafer with photoresist, such as flow coating, roller coating, spray coating, dip coating, and spin coating (also known as whirl coating). Spin coating is probably the most widely used coating method in the microelectronics industry today. In spin coating, a piece of substrate to be coated (e.g. a silicon wafer) is mounted on a disc centered on a shaft. An amount of photoresist is deposited on the center of the wafer. The disc is spun about the shaft at a constant rpm after a high initial acceleration rate. The centrifugal force generated by the spinning causes the photoresist coating to move out to the edges of the wafer and produces a thin coating on the surface of the wafer. Because the magnitude of the centrifugal force on the disc is proportional to the radius, the farther a point on the disc is away from the center of the disc, the stronger the centrifugal force at that point is. Although the surface tension of the liquid compensates to a large extent for the difference in centrifugal force, nevertheless, the thickness of the coating decreases as distance from the center increases, resulting in a non-uniform film.

SUMMARY OF THE INVENTION

The present invention is an improved method for coating a semiconductor wafer with a uniform liquid film, and more particularly for coating a silicon wafer with a liquid photoresist solution. The liquid is first deposited semi-uniformly on the wafer. Thereafter, the wafer is rotated about an axis perpendicular to the plane of the wafer and removed from the wafer.

In the preferred embodiment, a number of wafers are placed about the perimeter of a large, flat disc which is rotated about its center. A photoresist solution is sprayed on the wafers and is spread over the surface of the wafers by the centrifugal force generated by such rotating. By placing the wafers at a distance from the axis of rotation, the centrifugal force on all points of the wafer is approximately the same, thereby providing for a substantially uniform spreading of the film over the wafer, although the film coating closest to the center of the disc will be slightly thicker. The uniformity of the film coating is thus much improved over a method where a wafer is spun about its own axis and the centrifugal force varies greatly from zero to a higher value.

In the preferred embodiment, each wafer on a disc is separated by a baffle which prevents the liquid film which is spun off of one wafer from splattering on to an adjoining wafer. In a further refinement, each wafer is mounted on a floating platform which is attached to the disc. The platform would be mounted on ball bearings or a lubricant to allow it to freely rotate. This allows each wafer to self-rotate about its own axis while the disc is spinning. Thus, the small difference in centrifugal force between the inner edge of a wafer on the disc and the outer edge of the wafer is compensated for by allowing each point on the wafer to vary between such values by rotating about the wafer's own axis. Separate motors may be attached to each of such floating platforms to further control the rotation of each wafer about its own axis. This provides for better controlled rotational speed than could be achieved by allowing the wafers to self-rotate. By using separate motors, the liquid film can be placed in the center of the wafer, as in the conventional spin coating method, thus eliminating the need for first spraying the film to produce a semi-uniform deposit.

BRIEF DESCRIPTION OF THE DRAWINGS

FIG. 1 is a pair of charts showing the variation of centrifugal force and film thickness with distance from the center of a rotating disc.

FIG. 2 is a perspective view of a preferred embodiment of the present invention.

FIG. 3 is a side plan view of the preferred embodiment of the mounting of a wafer to the disc.

FIG. 4 is a side plan view of the preferred embodiment of the mounting of a wafer to the disc on a floating platform.

FIG. 5 is a side plan view of the preferred embodiment of the mounting of a wafer to a platform with a floating platform and a separate motor.

DETAILED DESCRIPTION OF THE PREFERRED EMBODIMENTS

As can be seen from FIG. 1, the centrifugal force generated by rotation of a wafer increases proportionally to the distance from the center of the axis of rotation. This is shown by the line 10. The thickness of a liquid film placed on a flat rotating wafer will be altered because the centrifugal force will tend to force the film outward and off of the spinning wafer. Because the centrifugal force is stronger the farther one gets from the center of the rotating wafer, the film will be thinner at such outer edges of the wafer. A curved line 12 represents the thickness of the film with respect to distance from the center of rotation. Curve 12 is given by the following equation:

$$\delta = \left[ \frac{3\pi}{2} \left( \frac{Qv}{\omega^2 r^2} \right) \right]^{\frac{1}{3}} \tag{1}$$

where δ is the coating thickness; Q is the volumetric flow rate; ν is the kinematic viscosity; ω is the angular velocity; and r is the radius.

This equation gives a qualitative distribution of film thickness which does not take into account the solvent diffusion rate or evaporation rate. Additionally, the relationship between film thickness and distance from the center (radius) given by curve 12 does not constitute an accurate representation at points very close to the center of rotation. However, although the film thickness does not exactly match curve 12, it will be somewhat thicker near the center of the wafer.

As can be seen from FIG. 1, a wafer 14 which is placed so that its center is also the center of rotation will have the film thickness vary greatly from point 0 to point A as shown by the graph. The placement of the wafers in the present invention would put a wafer 16 centered at a point C removed from the center of rotation. The film thickness varies only slightly over wafer 16 as represented by the difference in curve 12 between points B and D. This variation can be further minimized by allowing wafer 16 to rotate about its own axis as well, thereby causing the centrifugal force at any given point on wafer 16 to vary within the range between point B and point D. Thus, wafer 16 should have a film thickness somewhere between that shown at point B and that shown at point D.

The preferred embodiment of the present invention is shown in FIG. 2. A large disc 18 has a number of wafers 20 placed around its perimeter. The diameter of disc 18 is preferably at least four times the diameter of a wafer 20. Disc 18 is mounted on a shaft 22 which is driven by a motor 24. Motor 24 is controlled by a control system 25. A number of baffles 26 are placed between adjoining wafers 20.

In operation, each wafer 20 is sprayed with liquid film to produce a semi-uniform layer. Disc 18 is then spun about its center by shaft 22 which is driven by motor 24. After an initial high acceleration rate, disc 18 is spun at a desired uniform rate. As is well-known to those skilled in the art, the thickness and uniformity of the film coating can be varied by controlling the acceleration rate, the spin speed and the duration of such spinning.

The present invention can be applied to many different types of materials. For instance, the liquid film could be a polymer or a co-polymer. As is known to those skilled in the art, the thickness and uniformity of the liquid film depends upon the physical characteristics of such materials (e.g., the viscosity, the solid content, the density, etc.).

FIG. 3 shows a preferred method of mounting a wafer on disc 18. A wafer 20 is placed upon disc 18 over an O-ring 28. A vacuum tube 30 extends through disc 18 to the space between the disc and wafer 20 which is surrounded by O-ring 28. By applying a vacuum through vacuum tube 30, wafer 20 is pulled against O-ring 28 and secured to disc 18. A valve 31 can be closed to maintain the vacuum. Thus a vacuum pump need not remain attached to tube 30 when disc 18 is rotating. Alternately, the wafer could be mounted to the disc by any other method, such as, for example, by gluing or by using guards.

FIG. 4 shows a second preferred method of mounting a wafer 20 to disc 18. Wafer 20 is placed upon O-ring 32 which rests upon a platform 34. Platform 34 is a disc which is contained by circular sidewalls 36. Platform 34 rests upon a number of ball bearings 38 located in the cavity between sidewalls 36 and platform 34. Alternately, a lubricating fluid could be used instead of ball bearings 38. A vacuum tube 40 passes through disc 18 and platform 34, thereby providing a mechanism for securing wafer 20 to platform 34.

Because platform 34 is free-floating, the platform and the mounted wafer 20 will self-rotate about vacuum tube 40 when disc 18 is rotating. This will increase the uniformity of the film thickness by further reducing the difference in centrifugal force on each point on wafer 20 by allowing such points to pass through a range of difference distances from the center of disc 18.

FIG. 5 shows another preferred embodiment of the invention wherein a separate motor 42 is used to drive each platform 34. The motor drive system is connected to platform 34 via a shaft 44. The mounting structure is otherwise the same as depicted in FIG. 4, with platform 34 being supported by ball bearings 38 contained within sidewalls 36. Although wafer 20 is shown glued to O-ring 32, any other mounting method could be used. The use of an individual motor 42 allows each platform 34 to be rotated at a controlled speed and at a greater or lesser speed than would be attainable through self-rotation. The use of the individual motor also allows the liquid film to be placed in the center of a wafer 20 as in the conventional method, rather than first spray-coating wafer 20. The rotation of a wafer 20 about its own axis will spread the film over all parts of the wafer, while the rotation of disc 18 will even out the thickness of the film.

The present invention can be practiced with a number of variations without departing from the spirit of the invention. For instance, the motor of FIG. 5 can be replaced by a single motor driving all of platforms 34 with a separate drive train attached to each platform. In another embodiment, disc 18 shown in FIG. 2 could be replaced with a series of discs mounted above each other and driven by a single shaft 22.

The disclosure of the preferred embodiments of the invention herein is intended to be illustrative, but not limiting, of the scope of the invention which is set forth in the following claims.

What is claimed is:

1. A method for coating semiconductor wafers with a liquid film comprising:

first, depositing a continuous non-uniform layer of the liquid film on the top of the wafers;

second, rotating the wafers about an axis perpendicular to the plane of the wafers and removed from the wafers to spread said film substantially uniformly across said wafers; and third, preventing liquid film deposited on one wafer from contacting another wafer during said rotation without reflecting said liquid film back onto said first wafer.

2. The method of claim 1 wherein said wafer is allowed to float so that it will rotate about an axis through its center and perpendicular to the plane of said wafer while it is rotating about said removed axis.

3. The method of claim 1 further comprising the step of rotating said wafer about an axis through its center and perpendicular to the plane of said wafer while said wafer is rotating about said removed axis.

4. A method for coating a plurality of semiconductor wafers with a liquid film comprising:

mounting said plurality of wafers proximate the perimeter of a disc sufficiently large to hold said wafers;

depositing a continuous non-uniform layer of said liquid film on said wafers;

rotating said disc about an axis through its center and perpendicular to the plane of said disc;

preventing said liquid film deposited on each wafer from contacting any other of said wafers during said rotating without reflecting said liquid film back onto a wafer; and allowing each wafer to rotate about an axis through its center and perpendicular to the plane of said wafer while said disc is rotating.

5. A method for coating a plurality of wafers with a liquid film comprising:

mounting said plurality of wafers proximate the perimeter of a disc sufficiently large to hold said wafers;

depositing a continuous non-uniform layer of said liquid film on said wafers;

rotating said disc about an axis through its center and perpendicular to the plane of said disc;

rotating each wafer about an axis through its center and perpendicular to the plane of said wafer while said disc is rotating; and preventing said liquid film deposited on each wafer from contacting any other of said wafers during said rotating without reflecting said liquid film back onto a wafer.

6. An apparatus for uniformly spreading a liquid film over a plurality of semiconductor wafers comprising:

means for rotating the wafers about an axis perpendicular to the plane of the wafers and removed from the wafers; and baffle means located between each of said wafers and spaced from said wafers for preventing liquid film deposited on each wafer from contacting another wafer during said rotating.

7. The apparatus of claim 6 further comprising means for allowing each said wafer to float so that it will rotate about an axis through its center and perpendicular to the plane of said wafer while it is rotating about said removed axis.

8. The apparatus of claim 6 further comprising means for rotating each said wafer about an axis through its center and perpendicular to the plane of said wafer while said wafer is rotating about said removed axis.

9. An apparatus for uniformly spreading a continuous non-uniform coating of a liquid film on a plurality of semiconductor wafers comprising:

disc means, sufficiently large to hold said wafers, for supporting said wafers;

means for mounting said plurality of wafers proximate the perimeter of said disc means;

means for rotating said disc means about an axis through its center and perpendicular to the plane of said disc means;

means for preventing said liquid film deposited on each wafer from contacting any other of said wafers while said disc means is rotating without reflecting said liquid film back into a wafer; and means for allowing each wafer to float so that it will rotate about an axis through its center and perpendicular to the plane of said wafer while said disc means is rotating.

10. An apparatus for coating a plurality of semiconductor wafers comprising:

disc means, sufficiently large to hold said wafers, for supporting said wafers;

means for mounting said plurality of wafers proximate the perimeter of said disc means;

means for rotating said disc means about an axis through its center and perpendicular to the plane of said disc means;

means for rotating each wafer about an axis through its center and perpendicular to the plane of said wafer while said disc means is rotating; and means for preventing said liquid film deposited on each wafer from contacting any other of said wafers while said disc means is rotating without reflecting said liquid film back onto a wafer.

11. The apparatus of claim 6 wherein said means for rotating comprises a disc, said wafers being mounted on said disc proximate the outer edge of said disc in a position elevated above a top surface of said disc.

12. An apparatus for coating a plurality of semiconductor wafers with a uniform liquid film comprising:

a disc having a flat top surface;

a motor coupled to said disc for rotating said disc about its center;

a plurality of platforms attached to said disc proximate the edge of said disc, each said platform being adapted to hold a wafer above said top surface of said disc, each said platform being rotatable about its center; and a plurality of elongated baffles mounted to said disc intermediate and spaced from said platforms, each of said baffles extending from a first point proximate the center of said disc to a second point proximate the edge of said disc.

* * * * *